(12) United States Patent
Linderman et al.

(10) Patent No.: US 9,537,036 B2
(45) Date of Patent: *Jan. 3, 2017

(54) INTERCONNECT FOR AN OPTOELECTRONIC DEVICE

(71) Applicant: SunPower Corporation, San Jose, CA (US)

(72) Inventors: Ryan Linderman, Oakland, CA (US);
Keith Johnston, Palo Alto, CA (US);
Thomas Phu, Alameda, CA (US);
Matthew Dawson, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 229 days.

This patent is subject to a terminal disclaimer.

(21) Appl. No.: 14/303,854

(22) Filed: Jun. 13, 2014

(65) Prior Publication Data

US 2014/0291852 A1    Oct. 2, 2014

Related U.S. Application Data

(63) Continuation of application No. 13/854,607, filed on Apr. 1, 2013, now Pat. No. 8,786,095, which is a
(Continued)

(51) Int. Cl.
*H01L 23/488* (2006.01)
*H01L 31/05* (2014.01)
(Continued)

(52) U.S. Cl.
CPC ......... *H01L 31/05* (2013.01); *H01L 23/49503* (2013.01); *H01L 31/024* (2013.01);
(Continued)

(58) Field of Classification Search
CPC .. H01L 23/488; H01L 23/48; H01L 23/49503; H01L 33/64; H01L 31/05
See application file for complete search history.

(56) References Cited

U.S. PATENT DOCUMENTS

| | | | | |
|---|---|---|---|---|
| 3,340,096 A | * | 9/1967 | Mann | ................... H01L 31/0508 136/244 |
| 3,454,774 A | * | 7/1969 | Wizenick | .............. H01L 23/488 136/244 |

(Continued)

FOREIGN PATENT DOCUMENTS

| | | |
|---|---|---|
| JP | 10-335686 | 12/1998 |
| KR | 10-0469141 | 6/2005 |
| WO | WO-2009073061 | 6/2009 |

OTHER PUBLICATIONS

International Search Report and Written Opinion from PCT/US2011/044743 mailed Mar. 2, 2012, 9 pgs.
(Continued)

*Primary Examiner* — Matthew Landau
*Assistant Examiner* — Krista Soderholm
(74) *Attorney, Agent, or Firm* — Blakely Sokoloff Taylor Zafman LLP

(57) ABSTRACT

Interconnects for optoelectronic devices are described. For example, an interconnect for an optoelectronic device includes an interconnect body having an inner surface, an outer surface, a first end, and a second end. A plurality of bond pads is coupled to the inner surface of the interconnect body, between the first and second ends. A stress relief feature is disposed in the interconnect body. The stress relief feature includes a slot disposed entirely within the interconnect body without extending through to the inner surface, without extending through to the outer surface, without
(Continued)

extending through to the first end, and without extending through to the second end of the interconnect body.

17 Claims, 4 Drawing Sheets

Related U.S. Application Data continuation of application No. 12/893,765, filed on Sep. 29, 2010, now Pat. No. 8,426,974.

(51) Int. Cl.
  *H01L 31/024* (2014.01)
  *H01L 31/048* (2014.01)
  *H01L 31/052* (2014.01)
  *H01L 23/495* (2006.01)
  *H01L 33/64* (2010.01)
  *H01L 31/044* (2014.01)
  *H01L 33/62* (2010.01)

(52) U.S. Cl.
  CPC .......... *H01L 31/044* (2014.12); *H01L 31/048* (2013.01); *H01L 31/052* (2013.01); *H01L 31/0504* (2013.01); *H01L 31/0508* (2013.01); *H01L 31/0516* (2013.01); *H01L 33/64* (2013.01); *H01L 33/62* (2013.01); *H01L 2924/0002* (2013.01); *Y02E 10/50* (2013.01)

(56) References Cited

U.S. PATENT DOCUMENTS

| | | | |
|---|---|---|---|
| 4,321,418 A | 3/1982 | Dran et al. | |
| 4,927,770 A | 5/1990 | Swanson | |
| 4,987,474 A | 1/1991 | Yasuhara et al. | |
| 5,011,544 A | 4/1991 | Gaddy et al. | |
| 5,053,083 A | 10/1991 | Sinton | |
| 5,100,808 A | 3/1992 | Glenn | |
| 5,139,427 A | 8/1992 | Boyd et al. | |
| 5,184,019 A | 2/1993 | Macarthur et al. | |
| 5,185,042 A | 2/1993 | Ferguson | |
| 5,360,990 A | 11/1994 | Swanson | |
| 5,369,291 A | 11/1994 | Swanson | |
| 5,391,235 A * | 2/1995 | Inoue ................ H01L 31/03921 | 136/244 |
| 5,468,652 A | 11/1995 | Gee | |
| 5,660,646 A | 8/1997 | Kataoka et al. | |
| 5,972,732 A | 10/1999 | Gee et al. | |
| 6,274,402 B1 | 8/2001 | Verlinden et al. | |
| 6,313,395 B1 | 11/2001 | Crane et al. | |
| 6,315,575 B1 | 11/2001 | Kajimoto | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 7,115,975 B2 | 10/2006 | Mori | |
| 7,148,774 B1 | 12/2006 | Shea et al. | |
| 7,154,361 B2 | 12/2006 | Babu et al. | |
| 7,161,105 B2 | 1/2007 | Sabisch | |
| 7,378,742 B2 | 5/2008 | Muthukumar et al. | |
| 7,390,961 B2 | 6/2008 | Aschenbrenner et al. | |
| 8,148,627 B2 * | 4/2012 | Rose ................ H01L 31/0516 | 136/244 |
| 8,636,198 B1 * | 1/2014 | Linderman ............. H01L 24/34 | 228/164 |
| 2002/0059952 A1 | 5/2002 | Shimada | |
| 2003/0029036 A1 | 2/2003 | Gerson | |
| 2003/0034062 A1 | 2/2003 | Stern et al. | |
| 2004/0040593 A1 | 3/2004 | Ho et al. | |
| 2005/0268959 A1 | 12/2005 | Aschenbrenner et al. | |
| 2006/0085167 A1 | 4/2006 | Warfield et al. | |
| 2007/0079863 A1 * | 4/2007 | Stan ................. H01L 27/142 | 136/244 |
| 2008/0035198 A1 | 2/2008 | Teppe et al. | |
| 2008/0216887 A1 * | 9/2008 | Hacke ................ H01L 31/0516 | 136/244 |
| 2009/0139557 A1 | 6/2009 | Rose et al. | |
| 2010/0144218 A1 | 6/2010 | Rose | |

OTHER PUBLICATIONS

Non-Final Office Action for U.S. Appl. No. 11/895,640, mailed Mar. 30, 2010, 16 pgs.
Non-Final Office Action for U.S. Appl. No. 11/895,640, mailed Jun. 2, 2010, 9 pgs.
Final Office Action for U.S. Appl. No. 11/895,640, mailed Oct. 13, 2010, 10 pgs.
Final Office Action for U.S. Appl. No. 11/895,640, mailed Mar. 16, 2011, 11 pgs.
Non-Final Office Action for U.S. Appl. No. 11/895,640, mailed Jul. 20, 2011, 10 pgs.
Non-Final Office Action for U.S. Appl. No. 11/140,460, mailed May 3, 2007, 16 pgs.
International Preliminary Report on Patentability for PCT Patent Application No. PCT/US2011/044743 mailed Apr. 11, 2013, 6 pgs.
"Flipper", (retrieved onApr. 25, 2007), 1 pg., retreived from the internet website <http://jwgoerlich.solarbotics.net/robots/flipper/default.htm>, illustrating work completed in Oct. 2003.
"Flipper Turbot Build Sheet", (retrieved on Apr. 25, 2007), 4 pgs., retreived from the internet website <http://jwgoerlich.solarbotics.net/robots/flipper/build_sheet.htm>, illustrating work completed in Oct. 2003.
"The Glue Store—Adhesives 101", Retrieved on Oct. 15, 2013, 5 pgs, (Retrieved from the internet: <http://www.glue-store.com/adhesives101.html>).
Considine, Douglas M., "Van Nostrand's Scientific Encyclopedia Seventh Edition", New York, Van Nostrand Reinhold, 1989, p. 1096.
CSE, "CSE Distributors PVC Tape", Archive.org website, retrieved onApr. 25, 2007, 2 pgs., retreived from the internet: <http://www.csedistributors.com/acatalog/PVC_Tape.html>.
Cullen, Richart A., "Maximum Power Point Tracking", (retreived on Feb. 24, 2007) Retrieved from the internet: <http://www.earthtoys.com/emagazine.php?issue_number=03.02.01&article=power_point_tracking>, 5 pgs.
Esram, Trishan , et al., "Comparison of Photovoltaic Array Maximum Power Point Tracking Techniques", IEEE Transactions on Energy Conversion, vol. 22, No. 2, Jun. 2007, 11 pgs.
E-T-A Circuit Breakers, "E-T-A Annouces Remote Power Controller Utilizing Smart Circuit Breaker Technology", Chicago, Feb. 23, 2004, E-1048-800 Smart Circuit Breaker, The National Design Engineering Show, 3 pgs.
Freescale Semiconductor, Inc., "DSP56F80x in Power Line Modem Applications", 2004-2006 Freescale Semiconductor, Inc. webpage (online) (retreived on Nov. 20, 2006), retrieved from the internet: http://www.freescale.com/webapp/sps/site/application.jsp?nodeId=023Z1Dj0Tcf5hr, 6 pgs.
McIntosh, Keith R., et al., "The Choice of Silicon Wafer for the Production of Low-Cost Rear-Contact Solar Cells", May 2003, 4 sheets, Sunnyvale, California.
Mulligan, W. P., et al., "A Flat-Plate Concentrator: Micro-Concentrator Design Overview", 2000, 3 sheets, proceedings of the 28th IEEE PVSC.
Mulligan, William P., et al., "Development of Chip-Size Silicon Solar Cells", 2000, 6 sheets, Proceedings of the 28th IEEE PVSC.
Paul, C. W., "Hot_Melt Adhesives", MRS Bulletin, Jun. 2003, pp. 440-444.
Rose, Douglas H., et al., "Solar Cell Interconnect With Multiple Current Paths", U.S. Appl. No. 13/414,165, filed Mar. 7, 2012, 25 pgs.
Swanson, Richard M., "The Promise of Concentrators", 2000, pp. 93-111, Progress in Photovoltaics: Research and Applications.
Terao, Akira , et al., "A Mirror-Less Design for Micro-Concentrator Modules", 2000, 4 sheets, Proceedings of the 28th IEEE PVSC.

(56) References Cited

OTHER PUBLICATIONS

Texas Instruments, "OFDM Power Line Modem—System Block Diagrams", 1995-2006 Texas Instruments Incorporated, webpage (onlin) ( retrieved on Nov. 20, 2006), retrieved from the internet; http://focus.ti.com/vf/docs/blockdiagram.tsp?family=vf &blockDiagramid=6054, 2 pgs.
Verlinden, P. J., et al., "Backside-Contact Silicon Solar Cells with Improved Efficiency for the '96 World Solar Challenge", 1997, 5 sheets, Proceedings of the 15th EPSEC.
Verlinden, P. J., et al., "One-Year Comparison of a Concentrator Module with Silicon Point-Contact Solar Cell to a Fixed Flat Plate Module in Northern California", 2000, 4 sheets, Proceedings of the 16th EPSEC.
Verlinden, P. J., et al., "Will We Have a 20%-Efficient (PTC) Photovoltaic System?", 2001, 6 sheets, Proceedings of the 17th Europe Photovoltaic Solar Energy Conference.
Wind & Sun Electricity From the, Sun , "Maximum Power Point Tracking", pp. 1-7, (retrieved on Feb. 24, 2007), (Retrieved from the internet: <http://www.wind-sun.com/Change_Controls_Meters/PPT.htm>.
Office Action for Australian Patent Application No. 2011314342, mailed Mar. 7, 2014 3 pgs.
Office Action for European Patent Application No. 11832905.1, mailed Nov. 25, 2015, 7 pgs.
Office Action for Japanese Patent Application No. 2013-531574, dated Jan. 27, 2015, 3 pgs.
Office Action for Japanese Patent Application No. 2013-531574, dated Jul. 21, 2015, 3 pgs.
Non-Final Office Action from U.S. Appl. No. 13/854,607 mailed Jul. 12, 2013, 8 pgs.
Extended EP Search Report for EP App. 121 832 905.1 mailed Mar. 16, 2016, 10 pgs.

\* cited by examiner

INTERCONNECT FOR AN OPTOELECTRONIC DEVICE

CROSS-REFERENCE TO RELATED APPLICATIONS

This application is a continuation of U.S. patent application Ser. No. 13/854,607, filed Apr. 1, 2013, which is a continuation of U.S. patent application Ser. No. 12/893,765, filed Sep. 29, 2010, now U.S. Pat. No. 8,426,974, issued Apr. 23, 2013, the entire contents of which are hereby incorporated by reference herein.

TECHNICAL FIELD

Embodiments of the present invention are in the field of renewable energy and, in particular, interconnects for optoelectronic devices.

BACKGROUND

Light-emitting diode (LED) and photovoltaic (PV) devices are two common types of optoelectronic devices. Thermal management and assembly of optoelectronic systems, such as systems including LED and PV devices, may be considered when evaluating such systems for fabrication and deployment. For example, the area of systems of devices with cell interconnects is one area ripe for improvements in thermal management, stress management, and assembly. Challenges for the fabrication and deployment of such systems include a possible need for a low resistance thermal path in the interconnect, as well as a flexible accommodation of cells coupled to the interconnect.

DETAILED DESCRIPTION

Figure 1A:
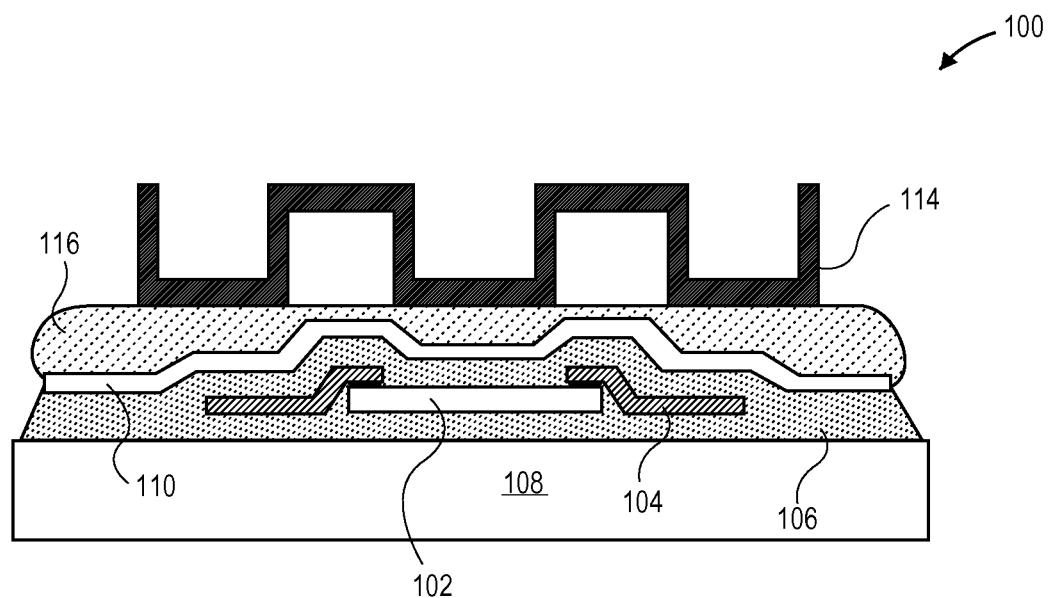
FIG. 1A illustrates a cross-sectional view of a laminated photovoltaic system, in accordance with an embodiment of the present invention.

Interconnects for optoelectronic devices are described herein. In the following description, numerous specific details are set forth, such as specific arrangements of stress relief features in interconnects, in order to provide a thorough understanding of embodiments of the present invention. It will be apparent to one skilled in the art that embodiments of the present invention may be practiced without these specific details. In other instances, well-known fabrication techniques, such as lamination techniques, are not described in detail in order to not unnecessarily obscure embodiments of the present invention. Furthermore, it is to be understood that the various embodiments shown in the Figures are illustrative representations and are not necessarily drawn to scale.

Disclosed herein are interconnects for optoelectronic devices. In one embodiment, an interconnect for an optoelectronic device includes an interconnect body including an inner surface, an outer surface, a first end, and a second end. The interconnect also includes a plurality of bond pads coupled to the inner surface of the interconnect body, between the first and second ends. The interconnect also includes a stress relief feature formed in the interconnect body, the stress relief feature having a plurality of T-shaped slots, each T-shaped slot approximately aligned with a corresponding one of the plurality of bond pads, the vertical portion of each T-shaped slot proximate to the corresponding one of the plurality of bond pads, and the horizontal portion of each T-shaped slot distal from the corresponding one of the plurality of bond pads.

In one embodiment, an interconnect for an optoelectronic device includes an inner surface, an outer surface, a first end, and a second end. The interconnect also includes a plurality of bond pads coupled to the inner surface of the interconnect body, between the first and second ends. The interconnect also includes a feature formed in the interconnect body, the feature having a first L-shaped extension at the first end of the interconnect body and a second L-shaped extension at the second end of the interconnect body, the horizontal bases of each of the first and second L-shaped extensions proximate to the inner surface and distal from the outer surface of the interconnect body.

In accordance with an embodiment of the present invention, an interconnect with one or more stress relief or L-shaped features is used to improve the reliability of a photovoltaic system and to allow for reduced stress levels in cell solder joints, cell interconnects, and in-laminate bypass diodes. In one embodiment, stress levels in components that are bonded to the interconnect and encapsulated within a photovoltaic laminate are reduced. In an embodiment, designs for interconnects described herein are improved over conventional interconnect designs, since the new designs account for the large coefficient of thermal expansion and rapid increase in stiffness of an encapsulant exposed to low temperature.

In an embodiment, the stress relief features designed into the interconnect address all components that are attached to the interconnect. For example, a series of different structures integrated within a cell interconnect may be used to reduce stress where each component is attached as well as to reduce stresses that would develop along a series of interconnects. In one embodiment, the stress relief features are designed to allow freedom of motion in the directions the components will be strained due to large temperature excursions of an associated photovoltaic system.

Encapsulants may typically be expected to reduce stress in a photovoltaic (PV) laminate due to their low modulus of elasticity. However, in accordance with an embodiment of the present invention, at extremely low temperatures near outdoor extremes or in unheated airplane storage cells, the encapsulant can approach its glass transition temperature. At the glass transition temperature, the modulus can increase by three orders of magnitude. At this point, the encapsulant becomes a stress driver within the package as it also has a very large thermal expansion coefficient. Thus, in an embodiment, stress relief features are utilized and designed to reduce the effects of an encapsulant that is becoming stiff and contracting due to low temperatures.

A common challenge related to reliable operation of laminated photovoltaic systems can be the minimization of thermal stress that develops during temperature excursions. An example of such a laminated photovoltaic system is provided in FIGS. 1A and 1B, in accordance with an embodiment of the present invention.

Figure 1B:
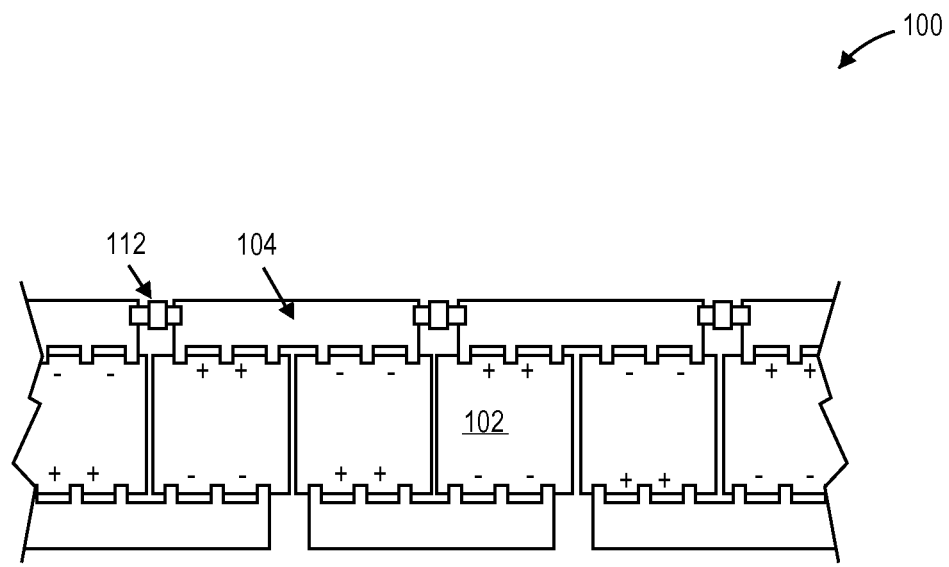
FIG. 1B illustrates a plan view of a laminated photovoltaic system, in accordance with an embodiment of the present invention.

Referring to FIG. 1A, in a cross-sectional view, and to FIG. 1B, in a plan view, a typical laminated solar cell package 100 includes an array of semiconductor solar cells 102 joined by metal interconnects 104 that are encapsulated within a polymer layer 106 between a glass superstrate 108 and a flexible polymer backsheet 110. In order to improve system performance, a bypass diode 112 between cell interconnects 104 as well as a heat sink 114 (via a thermal adhesive 116) may also be integrated, as shown in FIGS. 1A and 1B. Laminated solar cell packages also contemplated herein are solar cell packages such as those described in U.S. patent application Ser. No. 12/844,594 assigned to Sun-Power Corporation, entitled "Optoelectronic Device with Bypass Diode," filed on Jul. 27, 2010, the entire contents of which are hereby incorporated by reference herein.

Typically, a photovoltaic designer may focus on the thermal expansion mismatch of the glass, copper interconnects and silicon cells as the primary stress driver during thermal excursions, relying on the soft polymer encapsulant as a stress relieving feature. However, in an embodiment, at extremely cold temperatures the encapsulant often approaches its glass transition temperature and the stiffness modulus may increase by over two orders of magnitude. In addition to the rapid change in stiffness, the polymer encapsulant may have a relatively high thermal expansion coefficient several times larger than glass and metals. During these conditions, the typically soft encapsulant may become a major stress driver in the package.

Extremely cold temperatures are often realized overnight in outdoor environments as well as during transport in unheated airplane storage cells. In accordance with an embodiment of the present invention, for initial qualification and increased reliability, it is thus crucial that interconnect designs are capable of reducing stress on the components coupled together, e.g., primarily the bypass diodes and cells. In addition to thermal stress, there may also be a need to maximize the thermal coupling between the bypass diode and a heat sink mounted to the back of a laminated package in order to prevent thermal failure of the diode when operating in bypass mode.

In an aspect of the present invention, stress induced by an encapsulant at low temperatures and all intermediate ranges is reduced by incorporating several stress relief features at each interlinked component, as well as by extending additional heat spreading surfaces to regions below a heat sink in close proximity to a diode attachment point. For example, FIG. 2 illustrates a plan view of an interconnect for an optoelectronic device, in accordance with an embodiment of the present invention.

Figure 2:
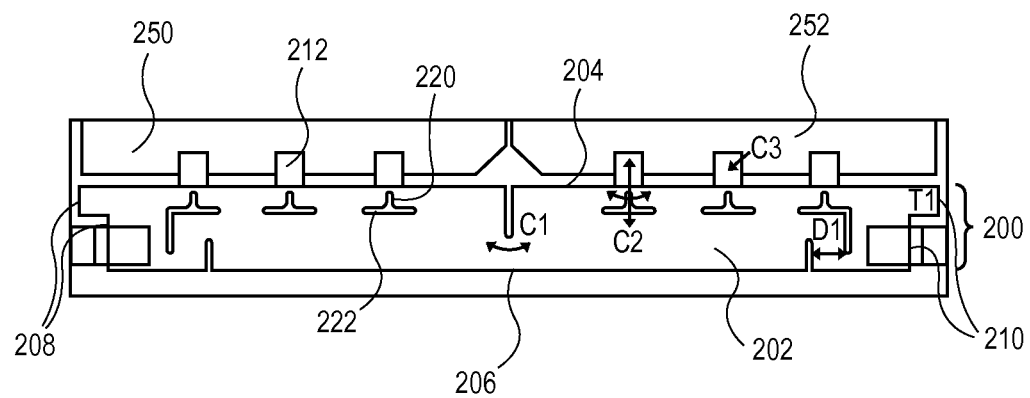
FIG. 2 illustrates a plan view of an interconnect for an optoelectronic device, in accordance with an embodiment of the present invention.

Referring to FIG. 2, an interconnect 200 includes an interconnect body 202 having an inner surface 204, an outer surface 206, a first end 208, and a second end 210. A plurality of bond pads 212 is coupled to the inner surface 204 of the interconnect body 202, between the first and second ends 208 and 210, respectively. In an embodiment, one or more stress relief features are formed in the interconnect body 202, as described in more detail below.

In accordance with an embodiment of the present invention, referring again to FIG. 2, the stress relief feature of interconnect 200 is a narrow slot C1 positioned in a location approximately equally between the first and second ends 208 and 210, respectively. The narrow slot C1 includes an opening at the inner surface 204 of the interconnect body 202 and extending into the interconnect body 202, but not through to the outer surface 206.

In one embodiment, feature C1 is a narrow slot cut into the center of the interconnect 200 that allows the bending of the interconnect at its mid-plane as needed if two cells (e.g., cells 250 and 252 partially depicted in FIG. 2) to which it is rigidly connected rotate to form an effective V-shape (see arrow below C1 in FIG. 2). Such rotation may be common given the periodic placement of interconnects down a linear array of cells, as depicted in FIG. 1B. In one embodiment, the length of C1 is determined based on the expected displacement of the cells and the maximum allowable stress in the interconnects and bond pads coupled to the cells. In a specific embodiment, feature C1 is typically around 7 millimeters for a 12 millimeter wide interconnect. However, if the length of C1 is too long, it may restrict electrical current flow and add excessive Ohmic losses. In one embodiment, the width of C1 is determined based on the manufacturing tolerances associated with punching or stamping operations as well as the need to reduce stress at the tip of the narrow slot. In a specific embodiment, a typical width for feature C1 is approximately in the range of 0.5-1 millimeters, and the tip is a fully rounded semicircle to reduce stress concentrations. A small width may also limit the length of an Ohmic bottleneck, which may conduct the full photocurrent of a string of cells.

In accordance with an embodiment of the present invention, referring again to FIG. 2, the stress relief feature of interconnect 200 is a plurality of T-shaped slots C2, each T-shaped slot C2 approximately aligned with a corresponding one of the plurality of bond pads 212. The vertical portion 220 of each T-shaped slot C2 is proximate to the corresponding one of the plurality of bond pads 212, and the horizontal portion 222 of each T-shaped slot C2 is distal from the corresponding one of the plurality of bond pads 212.

In one embodiment, feature C2 is a T-shaped slot in the interconnect 200 that allows both rotation and normal displacement of the interconnect 200 relative to a cell (e.g., cell 250 or 252). At extremely cold temperatures, an encapsulant may approach its glass transition temperature and, due to its high thermal expansion coefficient, act as a stress driver. Surprisingly, in this condition, the encapsulant may pull an interconnect closer to a cell. In one embodiment, feature C2 thus allows for a small deformation of the interconnect 200 towards a cell to relax strain in the encapsulant, limiting the stress at the cell-interconnect bond. In a specific embodiment, each of the three connections to a cell (e.g., the three connections on the right side of interconnect 200 made to cell 252) contributes approximately one-third of the cumulative photocurrent being conducted in the string. Between and below these connections, the current may flow substantially in the wider portion of the interconnect 200 below the C2 features. As such, an particular embodiment, the $I^2R$ losses associated with such features are low.

Figure 3:
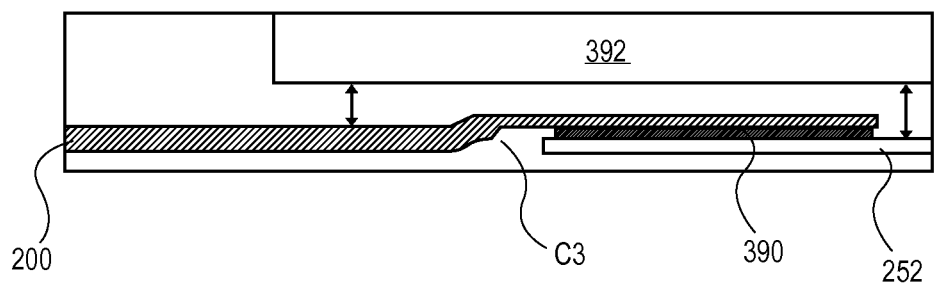
FIG. 3 illustrates a cross-sectional view of an interconnect for an optoelectronic device highlighting a vertical jog, in accordance with an embodiment of the present invention.

In accordance with an embodiment of the present invention, referring again to FIG. 2, the stress relief feature of interconnect 200 is a vertical jog C3 near to or at the location where one of the plurality of bond pads 212 is coupled to the inner surface of the interconnect body 202. FIG. 3 illustrates a cross-sectional view of an interconnect for an optoelectronic device highlighting a vertical jog, in accordance with an embodiment of the present invention.

Referring to FIG. 3, in one embodiment, feature C3 is a vertical jog in the interconnect 200 that creates an out-of-plane mechanical coupling that reduces stress when the interconnect 200 is pulled closer to a cell (e.g., cell 252) by an encapsulant 390. In addition, in a specific embodiment, the thinner region not only further reduces the stress between the cell 252 and interconnect 200 but also reduces vertical height differential between a heat sink 392, cell 252, and interconnect 200, reducing thermal resistance from the cell 252 and an associated diode to ambient.

Figure 4:
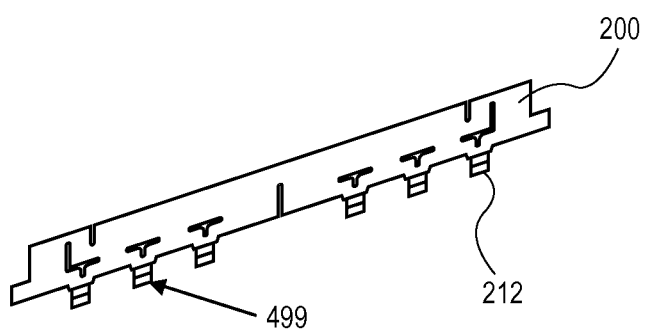
FIG. 4 illustrates an isometric view of an interconnect for an optoelectronic device highlighting a solder preform, in accordance with an embodiment of the present invention.

Furthermore, in an embodiment, referring to FIG. 4, solder performs 499 can be added to the cell bond pads 212 of the interconnect 200. In one embodiment, by preprocessing a solder pad onto the interconnect 200, the stringing or wiring of an array of cells can be performed at a much higher throughput and with a much tighter process control than by dispensing solder paste during cell-to-interconnect soldering. In accordance with an embodiment of the present invention, referring again to FIG. 2, the stress relief feature of interconnect 200 is a combination of slots DE D1 includes a first narrow slot in a location proximate to the second end 210 and distal from the first end 208 of interconnect 200. The first narrow slot includes an opening at the outer surface 206 of the interconnect body 202 and extending into the interconnect body 202, but not through to the inner surface 204. D1 also includes a second narrow slot between the first narrow slot and the second end 210. The second narrow slot is between and orthogonal to the inner and outer surfaces 204 and 206, respectively, but does not open into either of the inner and outer surfaces 204 and 206. Furthermore, the second narrow slot is coupled to the horizontal portion of an outer-most T-shaped slot C2 of the plurality of T-shaped slots, as depicted in FIG. 2.

In one embodiment, feature D1 is specifically designed to allow the ends 208 and 210 of the interconnect 200 to extend or retract to reduce stress on a diode package and to reduce any long-range stresses that might develop down an entire length of an array of cells. In a specific embodiment, feature D1 includes both the straight slot from the outside edge 206 of the interconnect 200 and the additional slot added to the T-shaped slot C2 at each bond pad 212. In a specific embodiment, feature D1 also allows expansion of the joints between a diode and interconnect 200 during the soldering or bonding assembly operations. If a soldering step is used to attach the diodes without feature D1, stress may increase as the components cool down from the soldering temperature. In a particular embodiment, for a long string of several interconnects and diodes, such stress is otherwise appreciable and would otherwise result in early failure of the diodes during lamination as well as in displacement of the cells from nominal positions.

In one embodiment, in the standard operating mode of the cells, feature D1 has a minimal electrical impact on the circuit as there is nearly zero electrical current flowing through the diode. The cell connections are oriented such that the outermost regions (left and right ends) of the interconnect 200 conduct approximately one-third of the cumulative photocurrent generated by the cells. As a result, in an embodiment, the $I^2R$ losses near feature D1 are substantially less than they would be if this feature were placed closer to the center of the interconnect 200 where a higher current always flows even when the diode is not in bypass mode. When the diodes are in bypass mode, the full string photocurrent may flow through and around feature D1. Thus, in an embodiment, D1 becomes a larger source of electrical losses. However, these losses are small compared to the power dissipation otherwise within the diode in bypass mode.

In accordance with an embodiment of the present invention, referring again to FIG. 2, interconnect 200 includes a feature T1 formed in the interconnect body 202. The feature T1 includes a first L-shaped extension at the first end 208 of the interconnect body 202, and a second L-shaped extension at the second end 210 of the interconnect body 202. The horizontal bases of each of the first and second L-shaped extensions are proximate to the inner surface 204 and distal from the outer surface 206 of the interconnect body 202.

In one embodiment, feature T1 is designed to increase thermal coupling between a diode and a heat sink that extends partially over the interconnect 202. For example, FIG. 5 illustrates an isometric view of a portion of an optoelectronic system with an internal bypass diode, in accordance with an embodiment of the present invention.

Figure 5:
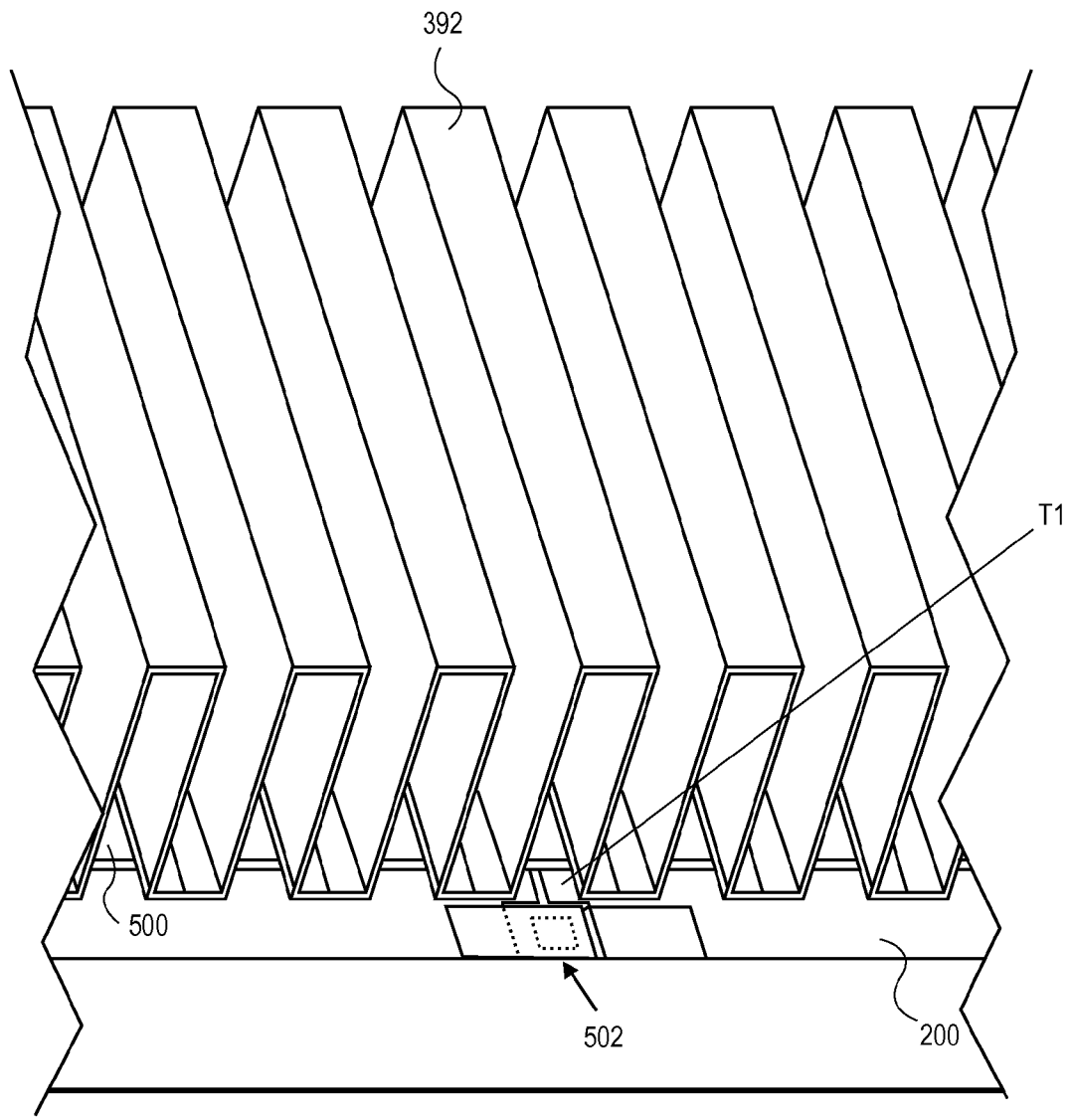
FIG. 5 illustrates an isometric view of a portion of an optoelectronic system with an internal bypass diode, in accordance with an embodiment of the present invention.

Referring to FIG. 5, in one embodiment, the L-shaped extension (or pair of extensions) to the interconnect 200 allows additional heat sink 392 fin coupling in close proximity to a diode (e.g., a cell 500 bypass diode) 502, thus reducing the thermal gradient to ambient for a diode operating in bypass mode. In a specific embodiment, the reduced temperature of the diode 502 also helps reduce any thermal stress that would develop due to an otherwise localized hot spot. In an embodiment, the L-shaped extension is an extended area for increased thermal coupling between an interconnect and a heat sink mounted to an optoelectronic system.

It is to be understood that different combinations, or even solo use of, one or more of the above features and stress relief features may be included in an interconnect. For example, in an embodiment, an interconnect for an optoelectronic device includes an interconnect body including an inner surface, an outer surface, a first end, and a second end. A plurality of bond pads is coupled to the inner surface of the interconnect body, between the first and second ends. A stress relief feature is formed in the interconnect body. The stress relief feature includes a plurality of T-shaped slots, each T-shaped slot approximately aligned with a corresponding one of the plurality of bond pads, the vertical portion of each T-shaped slot proximate to the corresponding one of the plurality of bond pads, and the horizontal portion of each T-shaped slot distal from the corresponding one of the plurality of bond pads.

In another embodiment, an interconnect for an optoelectronic device includes an interconnect body having an inner surface, an outer surface, a first end, and a second end. A plurality of bond pads is coupled to the inner surface of the interconnect body, between the first and second ends. A feature is formed in the interconnect body, the feature having a first L-shaped extension at the first end of the interconnect body and a second L-shaped extension at the second end of the interconnect body. The horizontal bases of each of the first and second L-shaped extensions are proximate to the inner surface and distal from the outer surface of the interconnect body.

In another embodiment, an interconnect for an optoelectronic device includes an interconnect body having an inner surface, an outer surface, a first end, and a second end. A plurality of bond pads is coupled to the inner surface of the interconnect body, between the first and second ends. A stress relief feature is formed in the interconnect body, the stress relief feature having a plurality of T-shaped slots, each T-shaped slot approximately aligned with a corresponding one of the plurality of bond pads. The vertical portion of each T-shaped slot is proximate to the corresponding one of the plurality of bond pads. The horizontal portion of each T-shaped slot is distal from the corresponding one of the plurality of bond pads. The interconnect also includes a first L-shaped extension at the first end of the interconnect body. A second L-shaped extension is at the second end of the interconnect body. The horizontal bases of each of the first and second L-shaped extensions are proximate to the inner surface and distal from the outer surface of the interconnect body.

In one embodiment, the stress relief feature further includes a first narrow slot in a location approximately equally between the first and second ends. The first narrow slot has an opening at the inner surface of the interconnect body and extends into the interconnect body, but not through to the outer surface. The stress relief feature further includes a second narrow slot in a location proximate to the first end and distal from the second end. The second narrow slot has an opening at the outer surface of the interconnect body and extends into the interconnect body, but not through to the inner surface. The stress relief feature further includes a third narrow slot between the second narrow slot and the first end. The third narrow slot is between and orthogonal to the inner and outer surfaces, but does not open into either of the inner and outer surfaces. Also, the third narrow slot is coupled to the horizontal portion of an outer-most T-shaped slot of the plurality of T-shaped slots. The stress relief feature further includes a vertical jog near to or at the location where one of the plurality of bond pads is coupled to the inner surface of the interconnect body.

In accordance with an embodiment of the present invention, an interconnect contemplated herein is a coupling interconnect. The coupling interconnect may be used to couple two optoelectronic cells, as described above in association with FIGS. 2, 4 and 5. However, in another embodiment, the interconnect is a terminal interconnect. For example, FIG. 6 illustrates a coupling interconnect that can be split to provide a pair of terminal interconnects, in accordance with an embodiment of the present invention.

Figure 6:
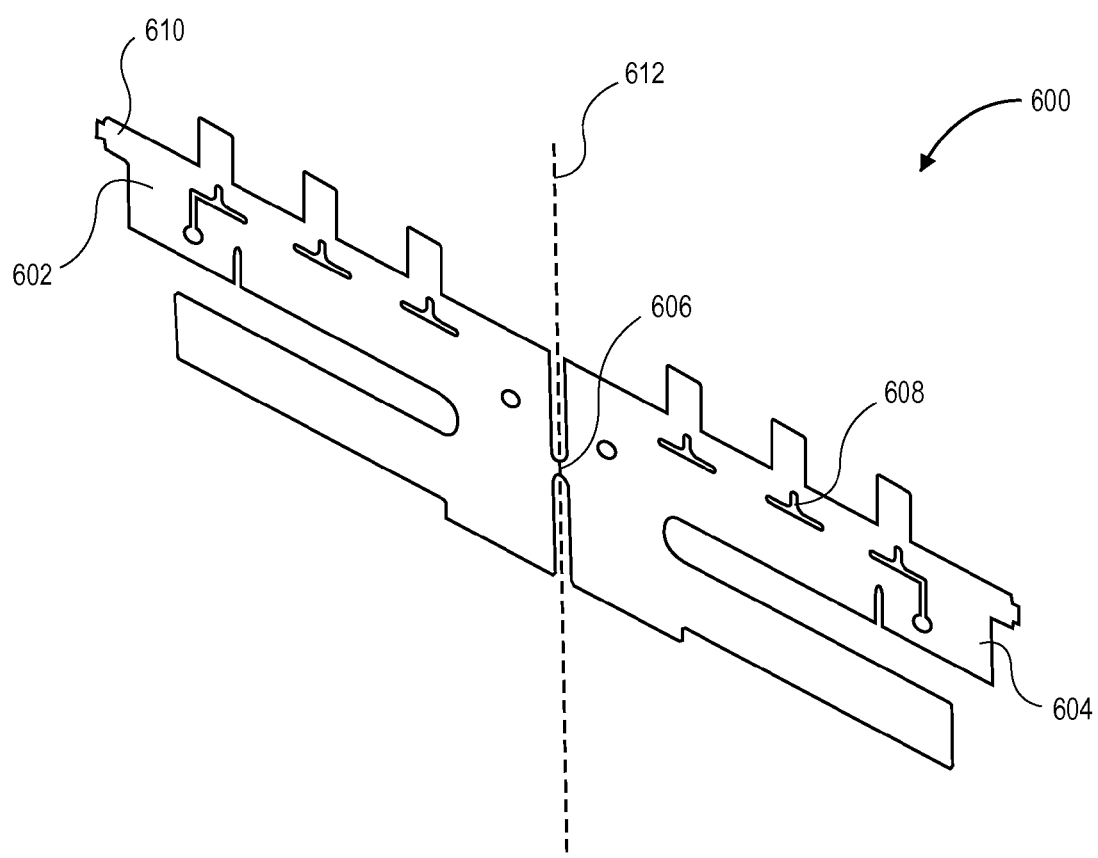
FIG. 6 illustrates a coupling interconnect that can be split to provide a pair of terminal interconnects, in accordance with an embodiment of the present invention.

Referring to FIG. 6, a coupling interconnect 600 includes a first half 602 and a second, symmetrical half 604 joined at a location 606 with the first half 602. Coupling interconnect 600 includes stress relief features 608 and other features described above, such as L-shaped features 610. Coupling interconnect 600 may be split along axis 612 to provide two terminal interconnects.

In association with the discussion of FIGS. 2-4 and 6 above, a plurality of interconnects, such as interconnect 200 or 600, may be included in an optoelectronic system. Thus, in accordance with an embodiment of the present invention, an optoelectronic system includes a plurality of pairs of optoelectronic devices. In one embodiment, each optoelectronic device is a back-contact solar cell. The optoelectronic system also includes a plurality of bypass diodes, one or more of the bypass diodes disposed between each of the pairs of optoelectronic devices. The optoelectronic system also includes a plurality of heat spreader units, one or more of the heat spreader units disposed above, and extending over, each of the bypass diodes. The optoelectronic system also includes a plurality of heat sinks, one or more of the heat sinks disposed above each of the heat spreader units. In an embodiment, the optoelectronic system, interconnects or pairs of interconnects are disposed between pairs of optoelectronic devices, such as pairs of solar cells. In one embodiment, one or more of the interconnects has one or more of a stress relief feature and an L-shaped feature, such as the stress relief features and L-shaped features described above in association with interconnects 200 and 600.

In accordance with an embodiment of the present invention, a method of fabricating an interconnect for an optoelectronic device includes forming an interconnect body having an inner surface, an outer surface, a first end, a second end, and a plurality of bond pads coupled to the inner surface of the interconnect body, between the first and second ends. The method further includes forming one or more stress relief features and L-shaped features in the interconnect body, such as the stress relief features and L-shaped features described above in association with interconnects 200 and 600.

Thus, interconnects for optoelectronic devices have been disclosed. In accordance with an embodiment of the present invention, an interconnect for an optoelectronic device includes a stress relief feature. In one embodiment, the interconnect includes an interconnect body having an inner surface, an outer surface, a first end, and a second end. A plurality of bond pads is coupled to the inner surface of the interconnect body, between the first and second ends. A stress relief feature is formed in the interconnect body. The stress relief feature includes a plurality of T-shaped slots, each T-shaped slot approximately aligned with a corresponding one of the plurality of bond pads, the vertical portion of each T-shaped slot proximate to the corresponding one of the plurality of bond pads, and the horizontal portion of each T-shaped slot distal from the corresponding one of the plurality of bond pads. In accordance with another embodiment of the present invention, an interconnect for an optoelectronic device includes an L-shaped feature. In one embodiment, an interconnect includes an interconnect body having an inner surface, an outer surface, a first end, and a second end. A plurality of bond pads is coupled to the inner surface of the interconnect body, between the first and second ends. A feature is formed in the interconnect body, the feature having a first L-shaped extension at the first end of the interconnect body and a second L-shaped extension at the second end of the interconnect body. The horizontal bases of each of the first and second L-shaped extensions are proximate to the inner surface and distal from the outer surface of the interconnect body.

What is claimed is:

1. An interconnect for an optoelectronic device, the interconnect comprising:
   an interconnect body comprising an inner surface, an outer surface, a first end, and a second end;
   a plurality of bond pads coupled to the inner surface of the interconnect body, between the first and second ends of the interconnect body; and
   a first narrow slot disposed within the interconnect body and comprising an opening at the inner surface of the interconnect body, wherein the first narrow slot does not extend through to the outer surface of the interconnect body, does not extend through to the first end of the interconnect body, and does not extend through to the second end of the interconnect body.

2. The interconnect of claim 1, wherein the first narrow slot is positioned in a location approximately equally between the first and second ends of the interconnect body.

3. The interconnect of claim 2, further comprising:
   a second narrow slot in a location proximate to the first end of the interconnect body and distal from the second end of the interconnect body, the second narrow slot comprising an opening at the outer surface of the interconnect body and extending into the interconnect body, but not through to the inner surface of the interconnect body; and a third narrow slot between the second narrow slot and the first end of the interconnect body, the third narrow slot between and orthogonal to the inner and outer surfaces of the interconnect body, but not opening into either of the inner and outer surfaces of the interconnect body.

4. The interconnect of claim 1, further comprising:

a vertical jog near to or at the location where one of the plurality of bond pads is coupled to the inner surface of the interconnect body.

5. The interconnect of claim 2, further comprising:

a second narrow slot in a location proximate to the first end of the interconnect body and distal from the second end of the interconnect body, the second narrow slot comprising an opening at the outer surface of the interconnect body and extending into the interconnect body, but not through to the inner surface of the interconnect body;

a third narrow slot between the second narrow slot and the first end of the interconnect body, the third narrow slot between and orthogonal to the inner and outer surfaces of the interconnect body, but not opening into either of the inner and outer surfaces of the interconnect body; and a vertical jog near to or at the location where one of the plurality of bond pads is coupled to the inner surface of the interconnect body.

6. The interconnect of claim 1, wherein the interconnect is a coupling interconnect.

7. The interconnect of claim 1, wherein the interconnect is a terminal interconnect.

8. An interconnect for an optoelectronic device, the interconnect comprising:

an interconnect body comprising an inner surface, an outer surface, a first end, and a second end;

a plurality of bond pads coupled to the inner surface of the interconnect body, between the first and second ends;

a first narrow slot disposed within the interconnect body and comprising an opening at the inner surface of the interconnect body, wherein the first narrow slot does not extend through to the outer surface of the interconnect body, does not extend through to the first end of the interconnect body, and does not extend through to the second end of the interconnect body, and wherein the first narrow slot is positioned in a location approximately equally between the first and second ends of the interconnect body;

a first L-shaped extension at the first end of the interconnect body; and a second L-shaped extension at the second end of the interconnect body, the horizontal bases of each of the first and second L-shaped extensions proximate to the inner surface of the interconnect body and distal from the outer surface of the interconnect body.

9. The interconnect of claim 8, further comprising:

a second narrow slot in a location proximate to the first end of the interconnect body and distal from the second end of the interconnect body, the second narrow slot comprising an opening at the outer surface of the interconnect body and extending into the interconnect body, but not through to the inner surface of the interconnect body; and a third narrow slot between the second narrow slot and the first end of the interconnect body, the third narrow slot between and orthogonal to the inner and outer surfaces of the interconnect body, but not opening into either of the inner and outer surfaces of the interconnect body.

10. The interconnect of claim 8, further comprising:

a vertical jog near to or at the location where one of the plurality of bond pads is coupled to the inner surface of the interconnect body.

11. The interconnect of claim 8, further comprising:

a second narrow slot in a location proximate to the first end of the interconnect body and distal from the second end of the interconnect body, the second narrow slot comprising an opening at the outer surface of the interconnect body and extending into the interconnect body, but not through to the inner surface of the interconnect body;

a third narrow slot between the second narrow slot and the first end of the interconnect body, the third narrow slot between and orthogonal to the inner and outer surfaces of the interconnect body, but not opening into either of the inner and outer surfaces of the interconnect body; and a vertical jog near to or at the location where one of the plurality of bond pads is coupled to the inner surface of the interconnect body.

12. The interconnect of claim 8, wherein the interconnect is a coupling interconnect.

13. The interconnect of claim 8, wherein the interconnect is a terminal interconnect.

14. An interconnect for an optoelectronic device, the interconnect comprising:

an interconnect body comprising an inner surface, an outer surface, a first end, and a second end;

a plurality of bond pads coupled to the inner surface of the interconnect body, between the first and second ends;

a first slot disposed entirely within the interconnect body without extending through to the inner surface of the interconnect body, without extending through to the outer surface of the interconnect body, without extending through to the first end of the interconnect body, and without extending through to the second end of the interconnect body; and a vertical jog near to or at the location where one of the plurality of bond pads is coupled to the inner surface of the interconnect body.

15. The interconnect of claim 14, further comprising:

a second slot in a location proximate to the first end of the interconnect body and distal from the second end of the interconnect body, the second slot comprising an opening at the outer surface of the interconnect body and extending into the interconnect body, but not through to the inner surface of the interconnect body; and a third slot between the second slot and the first end of the interconnect body, the third slot between and orthogonal to the inner and outer surfaces of the interconnect body, but not opening into either of the inner and outer surfaces of the interconnect body.

16. The interconnect of claim 14, wherein the interconnect is a coupling interconnect.

17. The interconnect of claim 14, wherein the interconnect is a terminal interconnect.

* * * * *